US006844557B2

(12) United States Patent
Miller

(10) Patent No.: US 6,844,557 B2
(45) Date of Patent: Jan. 18, 2005

(54) SYSTEM FOR, AND METHOD OF, IRRADIATING OPPOSITE SIDES OF AN ARTICLE

(76) Inventor: Robert Bruce Miller, P.O. Box 8409, Albuquerque, NM (US) 87198

(*) Notice: Subject to any disclaimer, the term of this patent is extended or adjusted under 35 U.S.C. 154(b) by 0 days.

(21) Appl. No.: 10/224,062

(22) Filed: Aug. 20, 2002

(65) Prior Publication Data

US 2004/0036039 A1 Feb. 26, 2004

(51) Int. Cl.[7] ........................ G01N 21/00; G01N 23/00; H01J 37/20

(52) U.S. Cl. ............................... 250/453.11; 250/492.3; 250/492.1; 250/396 ML

(58) Field of Search ......................... 250/453.11, 492.1, 250/492.3, 396 ML, 455.11, 454.11

(56) References Cited

U.S. PATENT DOCUMENTS 4,075,496 A * 2/1978 Uehara .................... 250/492.3
4,201,920 A * 5/1980 Tronc et al. ............. 250/492.3
4,252,413 A * 2/1981 Nablo ........................ 250/310
4,281,251 A * 7/1981 Thompson et al. ......... 250/398
4,492,873 A * 1/1985 Dmitriev et al. ......... 250/492.3
5,004,926 A * 4/1991 Vassenaix et al. ....... 250/492.3
5,847,401 A * 12/1998 McKeown et al. .. 250/396 ML
6,486,482 B1 * 11/2002 Anderberg et al. ...... 250/492.3
6,529,577 B1 * 3/2003 Allen et al. .................... 378/69
6,653,641 B2 * 11/2003 Lyons et al. ............. 250/492.2

FOREIGN PATENT DOCUMENTS

SE WO 99/00801 * 1/1999

* cited by examiner

*Primary Examiner*—John R. Lee
*Assistant Examiner*—Kalimah Fernandez
(74) *Attorney, Agent, or Firm*—Peter K. Hahn; David E. Heisey; Luce, Forward, Hamilton & Scripps, LLP

(57) ABSTRACT

An accelerator directs an electron beam to a scanner which operates under microprocessor control to convert the beam into two (2) sets of spaced electron beamlets. A magnetic lens deflects the sets of beamlets to a spaced and substantially parallel relationship. A first dipole directs the first set of beamlets in a first direction to a first side of an article. A second dipole directs the second set of beamlets, in a second direction opposite to the first direction, to a second side of the article opposite to the first side of the article. In this way, a single accelerator irradiates two (2) opposite sides of the article with an enhanced precision, simplified controls, a significantly reduced number of components and reduced costs relative to the systems of the prior art. The electron beam may be converted to an x-ray beam which is then processed in the manner described above.

19 Claims, 3 Drawing Sheets

SYSTEM FOR, AND METHOD OF, IRRADIATING OPPOSITE SIDES OF AN ARTICLE

This invention relates to a system for, and a method of, using a single accelerator for irradiating two (2) opposite sides of an article. The invention particularly relates to a system for, and a method of, using a single accelerator to irradiate two (2) opposite sides of an article with enhanced precision, simplified controls, a significantly reduced number of components and reduced costs relative to the systems of the prior art.

BACKGROUND OF A PREFERRED EMBODIMENT OF THE INVENTION

It has been known for some time that drugs and medical instruments and implements have to be irradiated so that they will not cause patients to become ill from harmful bacteria when they are applied to the patients. Systems have accordingly been provided for irradiating drugs and medical instruments and implements. The drugs and the medical instruments and implements have then been stored in sterilized packages until they have been ready to be used.

In recent years, it has been discovered that foods can carry harmful bacteria if they are not processed properly or, even if they are processed properly, that the foods can harbor and foster the proliferation of such harmful bacteria if they are not stored properly or retained under proper environmental conditions such as temperature. Some of the harmful bacteria can even be deadly.

For example, harmful bacteria have been discovered in recent years in hamburgers prepared by one of the large hamburger chains. Such harmful bacteria have caused a number of purchasers of hamburgers at stores in the chain to become sick. As a result of this incident and several other similar incidents, it is now recommended that hamburgers should be cooked to a well done, or at least a medium, state rather than a medium rare or rare state. Similarly, harmful bacteria have been found to exist in many chickens that are sold to the public. As a result of a number of incidents which have recently occurred, it is now recommended that all chickens should be cooked until no blood is visible in the cooked chickens.

To prevent incidents such as discussed in the previous paragraphs from occurring, various industries have now started to irradiate foods before the foods are sold to the public. This is true, for example, of hamburgers and chickens. It is also true of fruits, particularly fruits which are imported into the United States from foreign countries.

In previous years, gamma rays have generally been the preferred medium for irradiating various articles. The gamma rays have been obtained from a suitable material such as cobalt and have been directed to the articles to be irradiated. The use of gamma rays has had certain disadvantages. One disadvantage is that irradiation by gamma rays is slow. Another disadvantage is that irradiation by gamma rays is not precise. This results in part from the fact that the strength of the source (e.g. cobalt) of the gamma rays decreases over a period of time and that the gamma rays cannot be directed in a sharp beam to the articles to be irradiated. This prevents all of the gamma rays from being useful in irradiating the articles.

In recent years, electron beams have been directed to articles to irradiate the articles. Electron beams have certain advantages over the use of gamma rays to irradiate articles. One advantage is that irradiation by electron beams is fast. For example, a hamburger patty having a square cross section can be instantaneously irradiated by a passage of an electron beam of a particular intensity through the hamburger patty. Another advantage is that irradiation by an electron beam is relatively precise because the strength of the electron beam remains substantially constant even when the electron beam continues to be generated over a long period of time. A further advantage is that the space occupied by the electrons and the direction of movement of the electrons can be precisely controlled since the electrons are in the form of a beam. A disadvantage is that the electrons can penetrate an article through only a limited distance. To increase the distance of penetration of the article, the electron beams can be directed to opposite sides of the article.

X-rays have also been used to irradiate articles. The x-rays may be formed from electron beams. An advantage in irradiating articles with x-rays is that the x-rays can irradiate articles which are thicker than the articles which are irradiated by electron beams. However, it would also be desirable to irradiate articles with x-rays from opposite sides of the articles to enhance the uniformity of the absorbed x-ray energy within the articles and to enhance the efficiency with which the x-ray energy is absorbed by the articles.

When an article is irradiated with radiant energy (e.g. electrons or x-rays) from opposite sides of an article, it would be desirable for the radiant energy to be obtained from a single accelerator. In this way, the radiant energy at the opposite sides of the article will be substantially identical so that each of the opposite sides of the article will receive substantially identical patterns of radiation. Furthermore, the costs will be minimized since accelerators are quite expensive.

The systems now in use for irradiating opposite sides of an article from a single accelerator have certain disadvantages. One disadvantage is that the systems require a large number of components each of which is quite expensive. Since there are a large number of components, there are a large number of controls for the components. Furthermore, these components and their controls occupy a large volume of space.

BRIEF DESCRIPTION OF A PREFERRED EMBODIMENT OF THE INVENTION

An accelerator directs an electron beam to a scanner. The scanner operates under microprocessor control to spread the beam into two(2) sets of spaced beamlets. A magnetic lens deflects the beamlets so that they are in a spaced and substantially parallel relationship. A first dipole directs the first set of beamlets in a first direction to a first side of an article that is to be irradiated. A second dipole directs the second set of beamlets in a second direction opposite to the first direction to a second side of the article opposite to the first side of the article. In this way, a single accelerator irradiates two (2) opposite sides of the article with an enhanced precision, simplified controls, a significantly reduced number of components and reduced costs relative to the systems of the prior art. The electron beam may be converted to an x-ray beam which is then processed in the manner described above to irradiate the opposite sides of the article.

This preferred embodiment uses a magnetic transport system consisting of a magnetic lens and two dipole magnets to direct the two sets of electron beamlets onto two sides of an article. Additional embodiments could use different magnetic transport systems which are well-known to persons skilled in the art.

DETAILED DESCRIPTION OF A PREFERRED EMBODIMENT OF THE INVENTION

Figure 4:
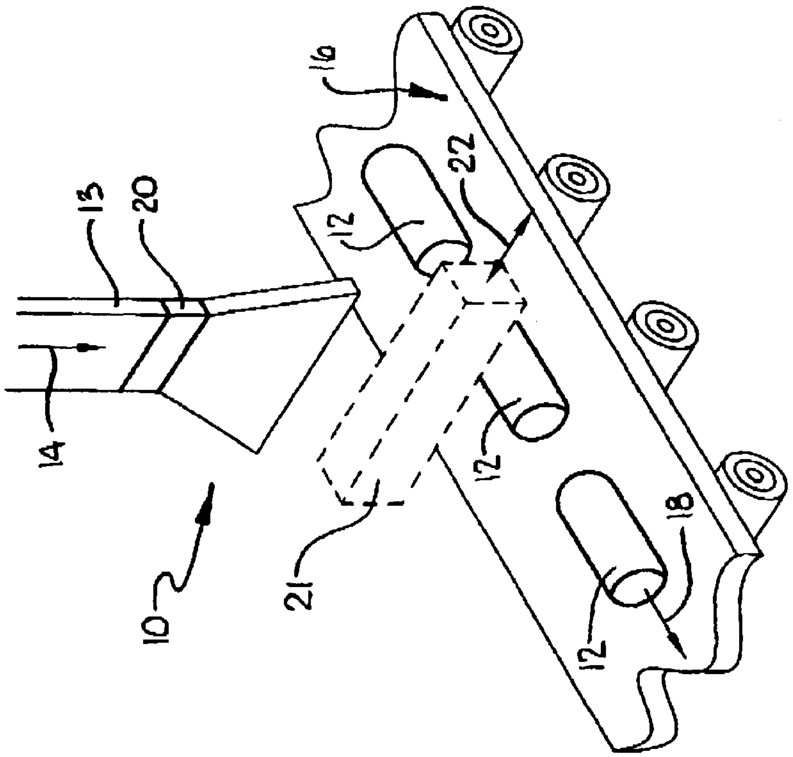
FIG. 4 PRIOR ART
FIG. 4 is a schematic perspective view of a system of the prior art for conveying an article in a first direction past a radiant energy beam, in a second direction opposite to the first direction, from an accelerator and for scanning the article from opposite sides of the article with radiation in a third direction substantially perpendicular to the first and second directions.

FIG. 4 is a schematic perspective view of a system, generally indicated at 10, of the prior art for irradiating an article 12. The system 10 includes an accelerator 13 for providing a beam of electrons in a first direction indicated by an arrow 14. A scanner generally indicated at 20 in FIG. 4 causes a periodic deflection of the electron beam in a direction 22 substantially perpendicular to the first direction 14. The electron beam may be used directly, or it may be converted into an x-ray beam when an x-ray converter 21 (shown in broken lines) is disposed beneath the scanner in FIG. 4 and the second direction. A conveyor generally indicated at 16 conveys the article 12 past the radiant energy beam (either electrons or x-rays) in a third direction 18 substantially perpendicular to the first direction 14 and the second direction. The conveyor 16 may be constructed in a manner well known in the prior art.

When the article 12 has variable characteristics (e.g. a variable thickness) in the scanning direction 22, the scanner 20 may be constructed in a manner similar to that disclosed and claimed in application 10/428,504 (attorneys file SUREB-58010) filed by Gary K. Loda and assigned of record to the assignee of record of this application. Although the scanner 20 in FIG. 4 scans only on one side of the article 12, systems are known in the prior art for scanning opposite sides of the article. For example, a system generally indicated at 30 in FIG. 1 is known in the prior art for scanning opposite sides of the article 12.

Figure 1:
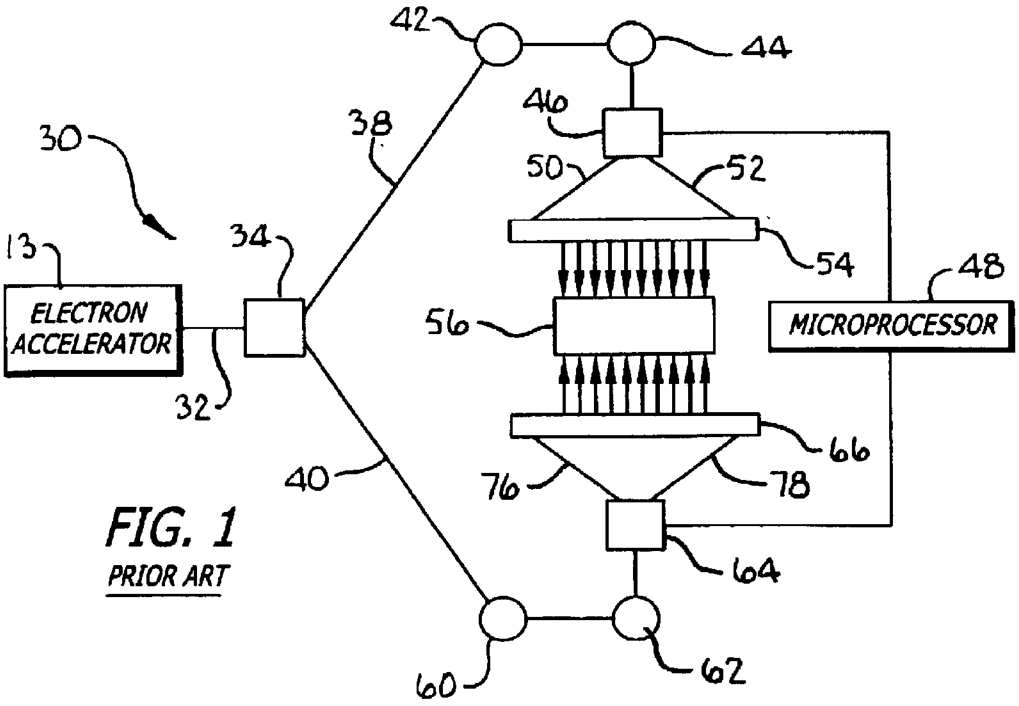
FIG. 1 PRIOR ART
FIG. 1 is a simplified schematic view of a system of the prior art for irradiating opposite sides of an article.

In the system shown in FIG. 1, the accelerator 13 provides an electron beam 32 to a beam splitter 34 which splits the beam into two (2) beamlets 38 and 40. The beam splitter 34 may illustratively be a dipole deflection coil. The beamlet 38 may be bent by a dipole 42 to extend in a substantially horizontal direction and by a dipole 44 to extend downwardly in a substantially vertical direction. The beamlet 38 may then be scanned by a scanner 46 so that the beamlet is deflected on a cyclic basis as by a variable voltage from a microprocessor 48 between a position 50 and a position 52. A magnetic lens 54 then bends the rays of the beam so that the rays extend vertically downwardly to a first side of an article 56. In like manner, a dipole 60 (corresponding to the dipole 42), a dipole 62 (corresponding to the dipole 44), a scanner 64 (corresponding to the scanner 46) and a magnetic lens 66 (corresponding to the magnetic lens 54) operate on the beamlet 40 to direct the beamlet substantially vertically upwardly to a second side of the article 56 opposite to the first side of the article. The magnetic lens 66 may be displaced from the magnetic lens 54 in the direction 18 in which the article 12 is moved by the conveyor 16.

Figure 3A:
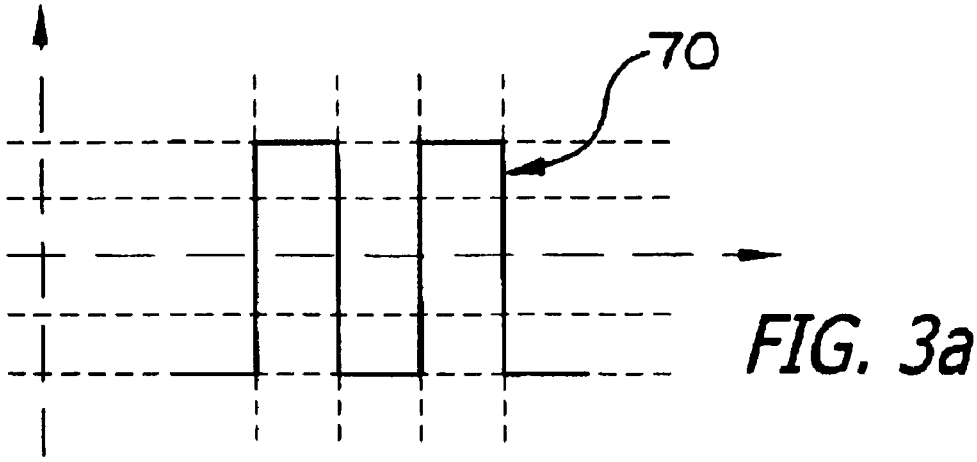
FIGS. 3*a*–3*c* are schematic representations of waveforms for scanning opposite sides of an article in accordance with the prior art to irradiate the opposite sides of the articles.
Figure 3B:
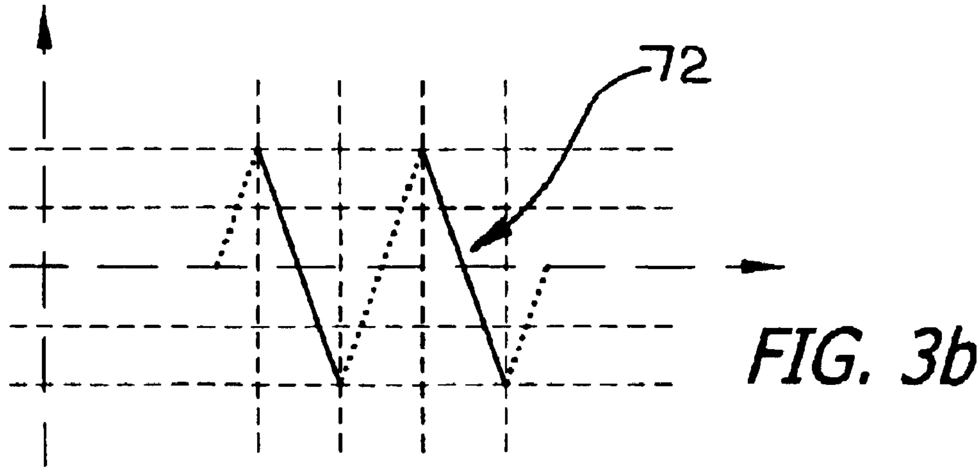
Figure 3C:
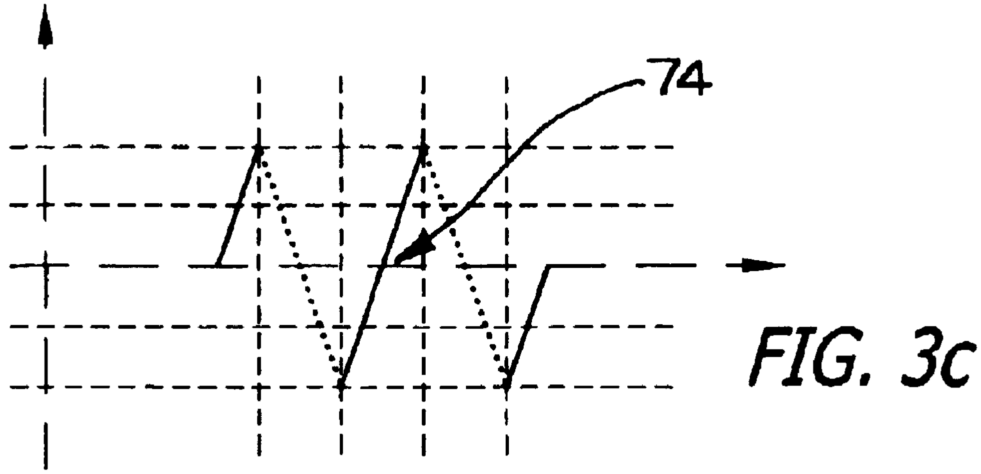

The microprocessor 48 may provide three scan signals as indicated in FIGS. 3*a*–3*c*. The first signal 70 directs the beam splitter 34 to deflect the electron beam 32 to form either the electron beamlet 38 or the electron beamlet 40. The second signal 72 controls the scanner 46 to provide a scan of the beamlet 38 between the positions 50 and 52. The third signal 74 controls the scanner 64 to provide a scan of the beamlet 40 between the positions 76 and 78.

The system 30 has certain significant disadvantages. One disadvantage is that it includes at least nine (9) separate magnetic structures-the beam splitter 34, the dipoles 42, 44, 60 and 62, the scanners 46 and 64 and the magnetic lenses 54 and 66. This does not include any solenoids which may be necessary or desirable for beam focusing. Furthermore, each of these nine (9) magnetic structures preferably has to be monitored and controlled. Another disadvantage is that the volume occupied by the nine (9) magnetic structures is quite large. For example, if each of the scanners 46 and 64 has a twenty-four inch (24") window and a maximum deflection angle of eleven degrees (11°), then the distance of the signal scanner 34 from the article is approximately five feet (5'). The height of the dipole magnet 44 above the top of the article 12 is therefore likely to be approximately seven feet (7') to eight feet (8'). In like manner, the distance between the dipole 62 and the bottom of the article 56 is also approximately seven feet (7') to eight feet (8'). A further disadvantage is that the microprocessor 48 has to provide separate signals to the beam splitter 34 and the scanners 46 and 64.

Figure 2:
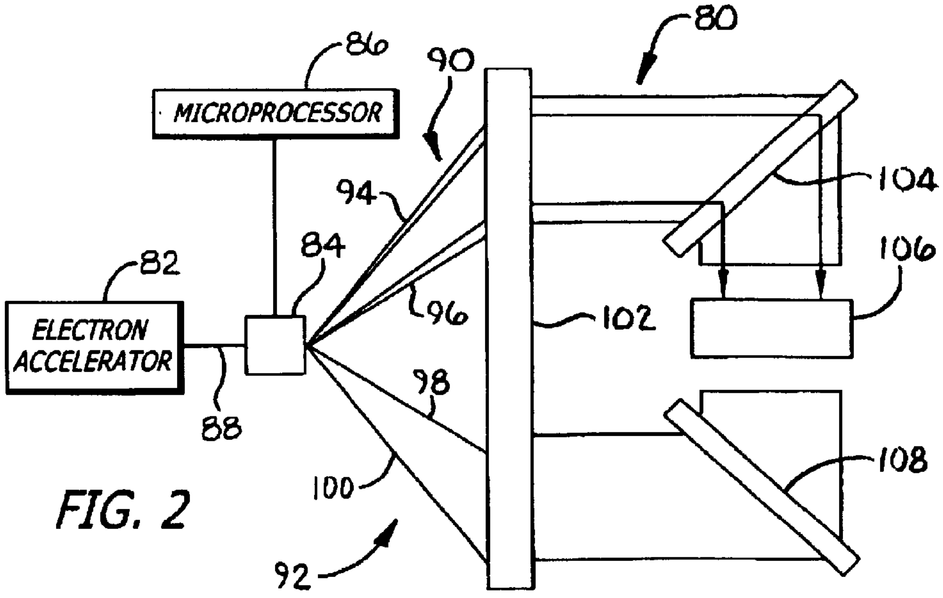
FIG. 2 is a schematic view of a system of a preferred embodiment of the invention for irradiating opposite sides of an article.

FIG. 2 shows a system generally indicated at 80 and constituting a preferred embodiment of the invention. This system 80 includes an accelerator 82 and a single scanner 84. The operation of the scanner 84 may be controlled by a microprocessor 86. The accelerator 82 provides an electron beam 88 and the scanner 84 operates under the control of the microprocessor 86 to provide two (2) sets of beamlets, generally indicated at 90 and 92. The first set of beamlets 90 is defined by positions 94 and 96 and the second set of beamlets 92 is defined by positions 98 and 100. Under the control of the microprocessor 86, no electron beam is produced by the scanner 84 between the positions 96 and 98.

The two (2) sets of beamlets 90 and 92 undergo magnetic deflection such as illustratively provided by the magnetic lens 102 which operates to provide a movement of the electron beamlets in a substantially horizontal direction. A dipole 104 then passes the first set of beamlets 90 and directs the beamlets to move substantially vertically downwardly to a top side of an article 106. Although the dipole 104 is constructed to pass the electron beamlets and bend the beamlets to the substantially vertical direction, the dipole may be constructed to reflect the electron beamlets to the vertical direction. In like manner, a dipole 108 may be disposed to direct the radiant energy vertically upwardly to the bottom side of the article 104.

Figure 5A:
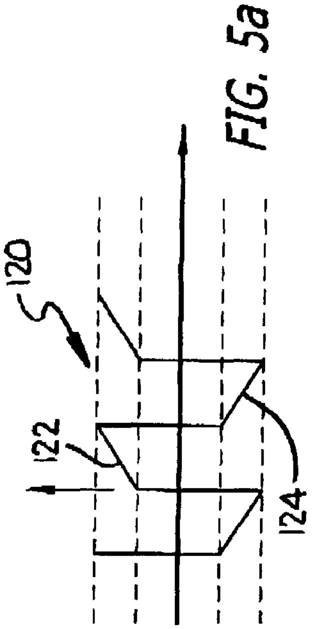
FIGS. 5*a*–5*d* are schematic representations of waveforms for scanning opposite sides of an article in the present invention to irradiate the opposite sides of the articles.
Figure 5B:
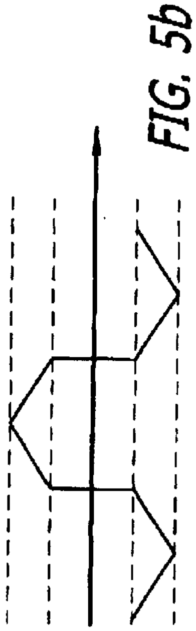
Figure 5C:
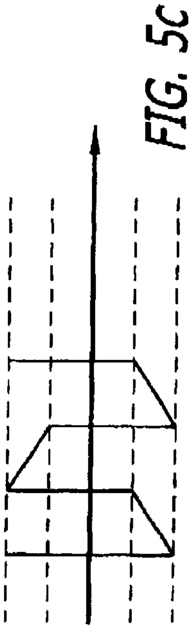
Figure 5D:
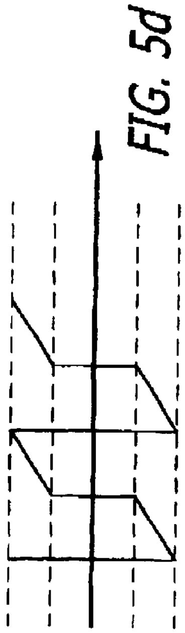

The microprocessor 86 may provide a simple scan generally indicated at 120 in FIG. 5*a*. The scan signal may include a first position 122 that directs the scanner 84 to form a first set of beamlets 90 generally between positions 94 and 96. The scan signal 120 may also include a second position 124 that directs the scanner 84 to form a second set of beamlets 92 generally between positions 98 and 100. FIGS. 5*b*, 5*c* and 5*d* illustrate other waveforms that may be applied to the single scanner 84.

The system 80 has certain important advantages. One advantage is that the system 80 includes only four (4) magnetic structures—the scanner 84, the magnetic lens 102 and the dipoles 104 and 108. Another advantage is that the volume occupied by the system 80 in FIG. 2 is considerably less than that occupied by the system 30 in FIG. 1. For example, the distance between the dipole 104 and the top of the article 106 in FIG. 2 may be approximately only three feet (3'). Still another advantage is that the scanner 84, operating in conjunction with the microprocessor 86, splits the beam 88 into the two(2) separate sets of beamlets 90 and 92 in addition to scanning the beamlets. By preventing electron beamlets from being produced between the position 96 in the beamlet 90 and the position 98 in the beamlet 92, the system 80 minimizes beam loss.

Although this invention has been disclosed and illustrated with reference to particular embodiments, the principles involved are susceptible for use in numerous other embodiments which will be apparent to persons of ordinary skill in the art. The invention is, therefore, to be limited only as indicated by the scope of the appended claims.

What is claimed is:

1. In combination for irradiating an article from first and second opposite sides of the article, an accelerator for providing an energy beam, a scanner for scanning the beam of energy to provide first and second sets of beamlets, a magnetic lens for directing the first and second sets of beamlets in a particular direction, and dipoles for respectively directing the sets of beamlets from the magnetic lens to the first and second opposite sides of the article.

2. In a combination as set forth in claim 1 wherein the scanner is operative on a cyclic basis to provide the first and second sets of beamlets and wherein the first set of beamlets is separated from the second set of beamlets.

3. In combination as set forth in claim 1 wherein the formation of the first and second sets of beamlets from the beam is provided by a microprocessor.

4. In combination as set forth in claim 1 wherein the accelerator provides the beam in a first direction and wherein a conveyor is provided to convey the article through the beamlets from the accelerator in a second direction substantially perpendicular to the first direction and wherein the scanner scans the beamlets in a third direction substantially perpendicular to the first and second directions.

5. In combination as set forth in claim 2 wherein a microprocessor is operative on the cyclic basis to provide the first and second sets of beamlets in the spaced relationship and wherein the accelerator provides the beam in a first direction and a conveyor is provided to convey the article through the beamlets in a second direction substantially perpendicular to the first direction and wherein the scanner scans the beamlets in a third direction substantially perpendicular to the first and second directions.

6. In combination as set forth in claim 1 wherein the beam and the beamlets are formed from electrons.

7. In combination as set forth in claim 1 wherein the electron beamlets are convened to x-rays.

8. In combination as set forth in claim 1 wherein the magnetic structure directs the first set of beamlets to the first side of the article and directs the second set of beamlets to the second side of the article.

9. In combination as set forth in claim 5 wherein the scanner is magnetic and wherein the scanner is controlled by a microprocessor.

10. In combination for irradiating an article from first and second opposite sides of the article, an accelerator for providing a beam of electrons, a scanner for scanning the beam of electrons to provide first and second sets of electron beamlets, a magnetic lens for directing the first and second sets of electron beamlets in a particular direction, and dipoles for respectively directing the electron beamlets from the magnetic lens to the first and second opposite sides of the article.

11. In combination as set forth in claim 10 wherein the scanner is operative on a cyclic basis to provide the first and second electron beamlets and wherein the first set of beamlets is spaced from the second set of beamlets.

12. In combination as set forth in claim 11 wherein a microprocessor is operative on the cyclic basis to provide the first and second sets of electron beamlets in the spaced relationship.

13. In combination as set forth in claim 10 wherein the accelerator provides the electron beam in a first direction and wherein a conveyor is provided to convey the article through the electron beamlets from the accelerator in a second direction substantially perpendicular to the first direction and wherein the scanner scans the electron beamlets in a third direction substantially perpendicular to the first and second directions.

14. In combination as set forth in claim 11 wherein a microprocessor is operative on the cyclic basis to provide the first and second sets of electron beamlets in the spaced relationship and wherein the accelerator provides the electron beamlets in a first direction and a conveyor is provided to convey the article through the electron beamlets from the accelerator in a second direction substantially perpendicular to the first direction and wherein the scanner scans the electron beamlets in a third direction substantially perpendicular to the first and second directions.

15. In combination as set forth in claim 14 wherein the scanner is operative on a cyclic basis to provide the first and second sets of electron beamlets in the spaced relationship.

16. In combination as set forth in claim 14 wherein the electron beamlets are converted to x-ray beams.

17. In combination as set forth in claim 14 wherein the scanner is magnetic and wherein the scanner is controlled by a microprocessor.

18. In combination as set forth in claim 10 wherein there are two (2) dipoles and wherein the dipoles are magnetic.

19. In a combination as set forth in claim 18 wherein the scanner is magnetic and wherein the scanner is controlled by a microprocessor and wherein there are two (2) dipoles and wherein the dipoles are magnetic.

* * * * *